United States Patent
Okamoto (10) Patent No.: US 9,123,696 B2
(45) Date of Patent: Sep. 1, 2015

(54) SEMICONDUCTOR DEVICE

(71) Applicant: FUJI ELECTRIC CO., LTD., Kawasaki-shi (JP)

(72) Inventor: Yujin Okamoto, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 232 days.

(21) Appl. No.: 13/964,601

(22) Filed: Aug. 12, 2013

(65) Prior Publication Data
US 2014/0070400 A1 Mar. 13, 2014

(30) Foreign Application Priority Data
Sep. 13, 2012 (JP) .................... 2012-202078

(51) Int. Cl.
| | |
|---|---|
| G05F 1/00 | (2006.01) |
| H01L 23/48 | (2006.01) |
| H01L 23/52 | (2006.01) |
| H01L 23/46 | (2006.01) |
| H01L 23/34 | (2006.01) |
| H01L 23/522 | (2006.01) |
| H01L 23/467 | (2006.01) |
| H01L 23/473 | (2006.01) |

(52) U.S. Cl.
CPC ............. *H01L 23/46* (2013.01); *H01L 23/34* (2013.01); *H01L 23/467* (2013.01); *H01L 23/473* (2013.01); *H01L 23/52* (2013.01); *H01L 23/5228* (2013.01); *H01L 2924/0002* (2013.01)

(58) Field of Classification Search
CPC ....... H01L 23/34; H01L 23/46; H01L 23/467; H01L 23/52; H01L 23/5228; H01L 23/473
USPC .......................................... 323/272
See application file for complete search history.

(56) References Cited

U.S. PATENT DOCUMENTS

2010/0008113 A1* 1/2010 Kuno et al. ............. 363/95
2012/0032710 A1* 2/2012 Tsukada .................. 327/109

FOREIGN PATENT DOCUMENTS

| JP | 2003-188336 A | 7/2003 |
| JP | 2006-041407 A | 2/2006 |
| JP | 2006-191774 A | 7/2006 |

* cited by examiner

*Primary Examiner* — Michael Lebentritt
*Assistant Examiner* — Aaron Dehne
(74) *Attorney, Agent, or Firm* — Rabin & Berdo, P.C.

(57) ABSTRACT

In a semiconductor device including semiconductor modules, it is possible to average the temperatures of the semiconductor modules. At least two semiconductor modules, wherein a plurality of semiconductor circuits, on which are mounted one or more semiconductor chips having a gate terminal and gate resistors connected to the gate terminals, are disposed in parallel, are disposed above a cooling body so that an array direction of the semiconductor circuits is a direction intersecting a refrigerant flow. At least one temperature detecting resistor is disposed in each semiconductor module, a gate signal is supplied to a gate signal input terminal of one semiconductor module of the at least two semiconductor modules via the temperature detecting resistor of the other semiconductor module, and a gate signal is supplied to a gate signal input terminal of the other semiconductor module via the temperature detecting resistor of the one semiconductor module.

8 Claims, 11 Drawing Sheets

SEMICONDUCTOR DEVICE

BACKGROUND OF THE INVENTION

1. Field of the Invention

The present invention relates to a semiconductor device, such as a power device or high frequency application switching IC, wherein semiconductor circuits having a semiconductor chip and gate resistor are disposed in parallel.

2. Description of the Background Art

Power converting inverter devices are widely used as one kind of power conversion device. For example, an electric motor is normally used as the drive source in an electric vehicle, hybrid vehicle, or the like, and inverter devices are widely utilized in controlling this kind of motor.

A semiconductor device configured of a semiconductor module wherein a plurality of circuit substrates on which is mounted a power device such as an insulated gate bipolar transistor (IGBT) or free wheeling diode (FWD) are disposed, and sealed into a predetermined form using a mold resin material, is used as this kind of power conversion device.

This semiconductor device is such that, as heat is generated from a semiconductor chip, semiconductor chip temperature management is necessary.

Heretofore, a power conversion device wherein temperature detection for protecting a power semiconductor element against heat is carried out in the vicinity of a part in which the power semiconductor element is packaged, and using a temperature detection element disposed in the vicinity of either one of an emitter terminal and collector terminal of the power semiconductor element, has been proposed as this kind of semiconductor device (for example, refer to JP-A-2006-41407).

Also, there has been proposed a power control circuit wherein, when a plurality of IGBT elements are disposed, the gate resistance value of an IGBT element with good cooling efficiency is set high while the gate resistance value of an IGBT element with poor cooling efficiency is set low (for example, refer to JP-A-2006-191774).

Furthermore, there has been proposed a thermistor-incorporating power semiconductor module configured with an inverter, or the like, wherein a plurality of power semiconductor chips of IGBTs or FETs are fixed to copper circuits, wherein a thermistor is disposed in a position near the power semiconductor chip on the copper circuit, and the thermistor is electrically connected to the gate of the power semiconductor chip, increasing the gate resistance value when the temperature of the power semiconductor chip is high, and reducing the gate resistance value when the temperature of the power semiconductor chip is low (for example, refer to JP-A-2003-188336).

However, the heretofore known examples described in JP-A-2006-41407, JP-A-2006-191774, and JP-A-2003-188336 are such that, although the temperature characteristics of each power semiconductor element or IGBT element are regulated, there is an unsolved problem in that no consideration is given to temperature management when semiconductor modules, wherein a plurality of semiconductor circuits on which is mounted a voltage controlling semiconductor element such as a power semiconductor element or IGBT element are arrayed, are disposed in parallel along a refrigerant flow.

SUMMARY OF THE INVENTION

Therefore, the invention, having been contrived focusing on the unsolved problem of the heretofore known examples, has an object of providing a semiconductor device such that, when a plurality of semiconductor modules are disposed in parallel along a refrigerant flow, it is possible to average the temperatures of the semiconductor modules.

In order to achieve the object, a first aspect of a semiconductor device according to the invention includes a semiconductor module wherein a plurality of semiconductor circuits on which are mounted one or more semiconductor chips having a gate terminal and a gate resistor connected to the gate terminal are disposed in parallel, a plurality of the semiconductor modules are disposed above a cooling body so that the array direction of the semiconductor modules is a direction following a refrigerant flow, and at least one temperature detecting resistor is disposed in each semiconductor module. Further, a semiconductor module positioned on the upstream side of the refrigerant flow and a semiconductor module positioned on the downstream side of the refrigerant flow are such that a gate signal is supplied via the temperature detecting resistor of the semiconductor module positioned on the downstream side of the refrigerant flow to a gate signal input terminal of the semiconductor module positioned on the upstream side of the refrigerant flow, while a gate signal is supplied via the temperature detecting resistor of the semiconductor module positioned on the upstream side of the refrigerant flow to a gate signal input terminal of the semiconductor module positioned on the downstream side of the refrigerant flow.

Also, a second aspect of the semiconductor device according to the invention includes a semiconductor module wherein a plurality of semiconductor circuits on which are mounted one or more semiconductor chips having a gate terminal and a gate resistor connected to the gate terminal are disposed in parallel, and four or more of the semiconductor modules are disposed above a cooling body in a direction following a refrigerant flow. Further, at least one temperature detecting resistor is disposed in each semiconductor module, and of the four or more semiconductor modules, a semiconductor module positioned on the most upstream side of the refrigerant flow and a semiconductor module positioned on the most downstream side of the refrigerant flow are such that a gate signal is supplied via the temperature detecting resistor of the semiconductor module positioned on the most downstream side of the refrigerant flow to a gate signal input terminal of the semiconductor module positioned on the most upstream side of the refrigerant flow, a gate signal is supplied via the temperature detecting resistor of the semiconductor module positioned on the most upstream side of the refrigerant flow to a gate signal input terminal of the semiconductor module positioned on the most downstream side of the refrigerant flow, a semiconductor module positioned next on the upstream side of the refrigerant flow after the semiconductor module positioned on the most upstream side of the refrigerant flow and a semiconductor module positioned next on the downstream side of the refrigerant flow after the semiconductor module positioned on the most downstream side of the refrigerant flow are such that a gate signal of one is supplied via the temperature detecting resistor of the other in the same way as in the case of the semiconductor module positioned on the most upstream side of the refrigerant flow and the semiconductor module positioned on the most downstream side of the refrigerant flow, and each set of corresponding semiconductor modules is configured in the same way.

Also, a third aspect of the semiconductor device according to the invention is such that each semiconductor module is such that the gate resistors of the semiconductor circuits on either of both end sides are connected to the gate terminals of the semiconductor chips of the semiconductor circuits in at least central portions, and the gate resistors of the semiconductor circuits in the central portions are connected to the gate terminals of the semiconductor chips of the semiconductor circuits on either of both the end sides.

Also, a fourth aspect of the semiconductor device according to the invention is such that the temperature detecting resistor is configured of a vertical diffusion structure forming a vertical direction current path or a discrete resistor, and has positive temperature-resistance characteristics.

Also, a fifth aspect of the semiconductor device according to the invention is such that the semiconductor chip is configured of a power controlling semiconductor element.

According to the invention, at least two semiconductor modules wherein a plurality of semiconductor circuits are disposed in parallel are disposed above a cooling body in a direction along a refrigerant flow, a temperature detecting resistor is disposed in each semiconductor module, and the semiconductor modules are such that a gate signal is supplied to a gate signal input terminal of a semiconductor module on the upstream side of the refrigerant flow via the temperature detecting resistor of a semiconductor module on the downstream side of the refrigerant flow corresponding to the semiconductor module on the upstream side of the refrigerant flow. Conversely, a gate signal is supplied to a gate signal input terminal of the semiconductor module on the downstream side of the refrigerant flow via the temperature detecting resistor of the semiconductor module on the upstream side of the refrigerant flow. Because of this, as the temperature detecting resistor of the semiconductor module with a low cooling effect on the downstream side of the refrigerant flow is connected in series to the gate resistor at the gate signal input terminal of the semiconductor module on the upstream side of the refrigerant flow, the gate resistance value increases, increasing switching loss and increasing the amount of heat generated, while conversely, the gate resistance decreases in the downstream side semiconductor module, reducing switching loss and reducing the amount of heat generated. Consequently, it is possible to reduce the temperature difference between the semiconductor modules. Because of this, it is possible to increase the freedom of design in terms of the layout according to the attained temperatures of the semiconductor modules and the design of the cooling fins.

BRIEF DESCRIPTION OF THE DRAWINGS

FIG. 6 is a characteristic diagram showing the relationship between gate resistance and switching loss when a half-bridge circuit is turned on;

DETAILED DESCRIPTION OF THE INVENTION

Hereafter, referring to the drawings, a description will be given of embodiments of the invention.

Figure 1:
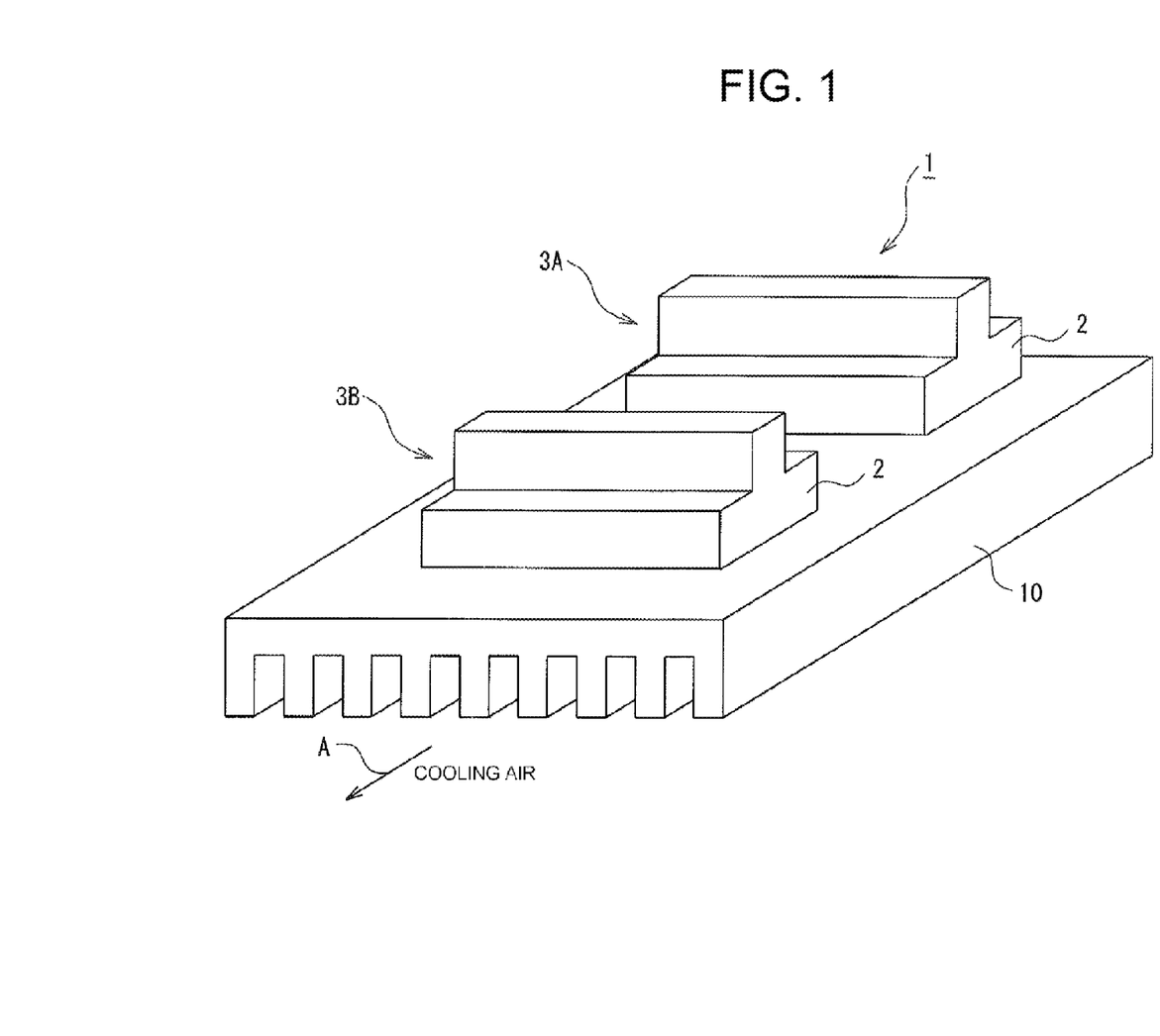
FIG. 1 is an external perspective view of a semiconductor device according to a first embodiment of the invention.
Figure 2A:
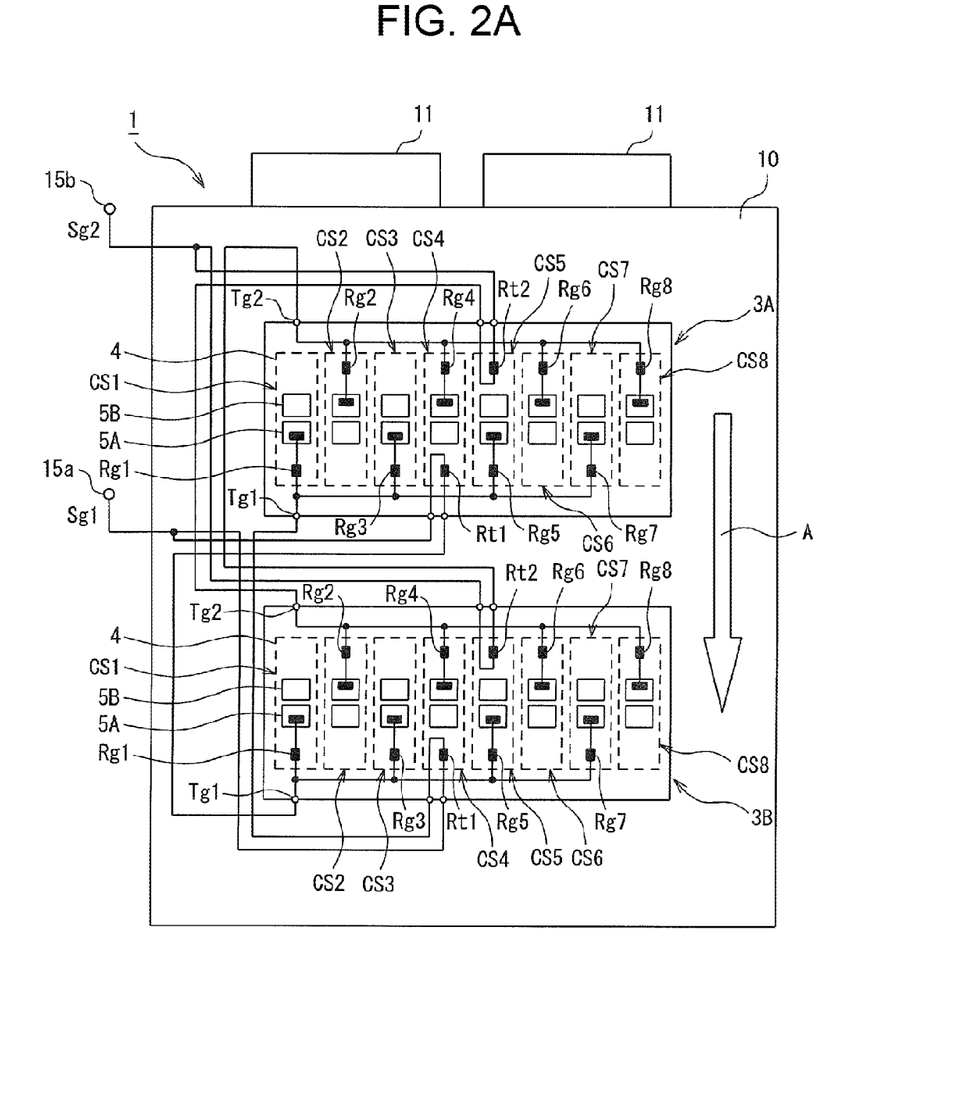
FIGS. 2A and 2B are a schematic configuration diagram showing, respectively, a circuit configuration of the semiconductor device of FIG. 1 and a corresponding characteristic diagram showing temperature distribution.
Figure 2B:
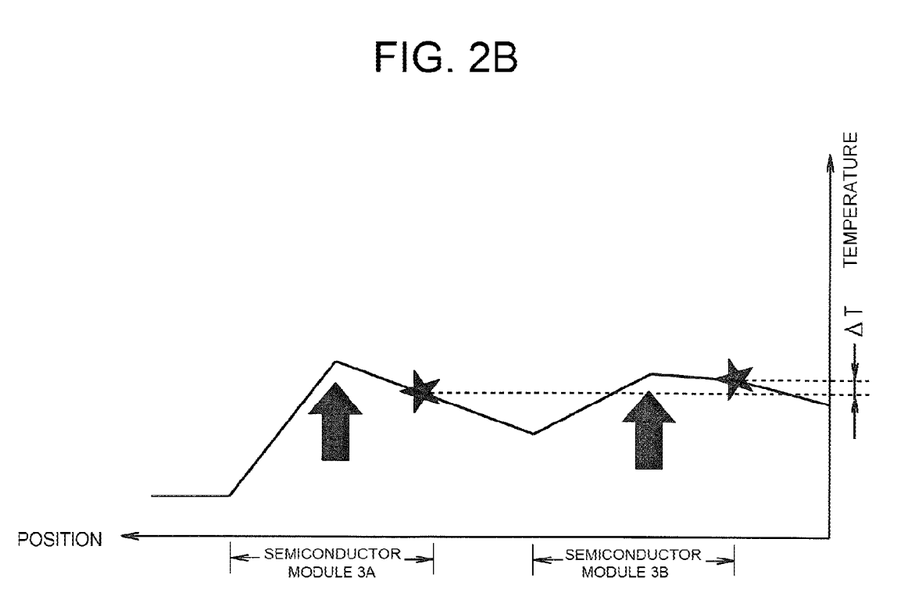

FIG. 1 is an external perspective view of a semiconductor device showing a first embodiment of the invention, while FIGS. 2A and 2B are a schematic configuration diagram of a circuit configuration showing, respectively, the first embodiment and a corresponding characteristic diagram showing temperature distribution.

A semiconductor device 1 includes, for example, two power semiconductor modules 3A and 3B configured by, for example, eight semiconductor circuits CS1 to CS8 being disposed in case bodies 2, in parallel and extending in the longitudinal direction of the case bodies 2. The case bodies 2 have a convex-shape when seen from the side, and the semiconductor circuits CS1 to CS8 are molded in, as shown in FIG. 2A. Each of the semiconductor circuits CS1 to CS8 is such that semiconductor chips 5A and 5B are mounted on an insulating substrate 4, as is particularly clear in FIG. 2A.

The semiconductor chip 5A is configured of a voltage controlling semiconductor element having the gate terminal of an insulated gate bipolar transistor (IGBT), a power metal-oxide-semiconductor field-effect transistor (MOSFET), or the like. Also, the semiconductor chip 5B is configured of, for example, a free wheeling diode (FWD).

Herein, the odd-numbered semiconductor circuits CS1, CS3, CS5, and CS7 are such that the semiconductor chip 5A is mounted on the front end side thereof, while the semiconductor chip 5B is mounted on the rear end side. Conversely, the even-numbered semiconductor circuits CS2, CS4, CS6, and CS8 are such that the semiconductor chip 5B is mounted on the front end side thereof, while the semiconductor chip 5A is mounted on the rear end side.

Further, a gate terminal G of the semiconductor chip 5A of each of the odd-numbered semiconductor circuits CS1, CS3, CS5, and CS7 is individually connected via gate resistors Rg1, Rg3, Rg5, and Rg7 to a common gate signal input terminal Tg1 into which is input a gate signal from an unshown gate signal formation circuit.

Also, the gate terminal G of the semiconductor chip 5A of each of the even-numbered semiconductor circuits CS2, CS4, CS6, and CS8 is individually connected via gate resistors Rg2, Rg4, Rg6, and Rg8, configured of vertical diffusers, to a common gate signal input terminal Tg2 into which is input agate signal from an unshown gate signal formation circuit.

Each of the gate resistors Rg1 to Rg8 is of a vertical diffusion structure forming a current path in a vertical direction.

Furthermore, a temperature detecting resistor Rt1 is disposed in front of the semiconductor chip 5B of the central portion oriented semiconductor circuit CS4, and in the same way, a temperature detecting resistor Rt2 is disposed behind the semiconductor chip 5B of the semiconductor circuit CS5.

Figure 3:
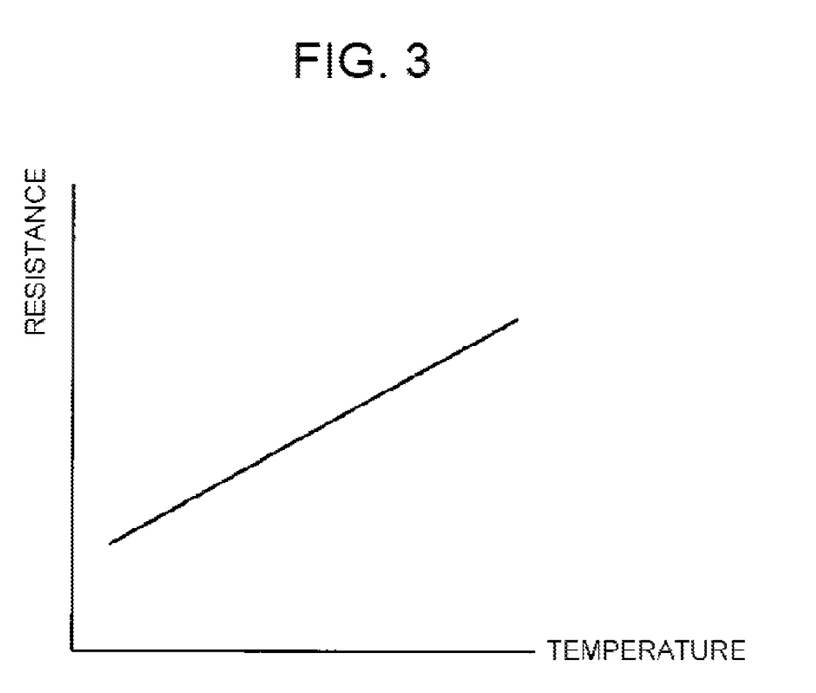
FIG. 3 is a characteristic diagram showing temperature characteristics of a gate resistor.

Herein, each of the temperature detecting resistors Rt1 and Rt2 has positive temperature-resistance characteristics such that the resistance value rises in accordance with a rise in temperature, as shown in FIG. 3, and is of a vertical diffusion structure that forms a current path in a vertical direction.

Further, with at least two of the power semiconductor modules having the heretofore described configuration, 3A and 3B, above cooling fins 10, cooling air acting as a refrigerant flow supplied from cooling fans 11 is supplied in a direction perpendicular to the longitudinal direction of the power semiconductor modules 3A and 3B, that is, from the rear side to the front side. Because of this, the cooling fins 10 extending in a front-back direction are formed on the lower surface side of the semiconductor device 1 so as to form channels allowing the cooling air to pass through, as shown in FIG. 1.

The resistance values of the gate resistors Rg1 to Rg8 may be arranged to be equal when supplying cooling air to the power semiconductor modules 3A and 3B in a front-back direction perpendicular to the longitudinal direction of the power semiconductor modules 3A and 3B in this way, but in this case, there is a tendency for the temperature in the central portions of the power semiconductor modules 3A and 3B to be high, while the temperature on either end side is low. Because of this, as the cooling effect in the central portion in the longitudinal direction of the power semiconductor modules 3A and 3B is low, it is preferable to average the temperature distribution in the longitudinal direction of the power semiconductor modules 3A and 3B by arranging that the resistance values of the gate resistors Rg4 and Rg5 are low, thereby reducing switching loss and reducing exothermic temperature, and arranging that the resistance values of the gate resistors sequentially increase from the central portion toward either side, thereby increasing switching loss and increasing exothermic temperature.

The semiconductor device 1 is such that gate signals supplied from the external gate signal formation circuits are supplied at differing times to gate signal input units 15a and 15b. A gate signal Sg1 input into the gate signal input unit 15a is supplied via the temperature detecting resistor Rt1 of the downstream side power semiconductor module 3B to the gate signal input terminal Tg1 of the upstream side power semiconductor module 3A. Also, the gate signal Sg1 input into the gate signal input unit 15a is supplied via the temperature detecting resistor Rt1 of the upstream side power semiconductor module 3A to the gate signal input terminal Tg1 of the downstream side power semiconductor module 3B.

Also, a gate signal Sgt input into the gate signal input unit 15b is supplied via the temperature detecting resistor Rt2 of the downstream side power semiconductor module 3B to the gate signal input terminal Tg2 of the upstream side power semiconductor module 3A. Also, the gate signal Sgt input into the gate signal input unit 15b is supplied via the temperature detecting resistor Rt2 of the upstream side power semiconductor module 3A to the gate signal input terminal Tg2 of the downstream side power semiconductor module 3B.

Figure 4:
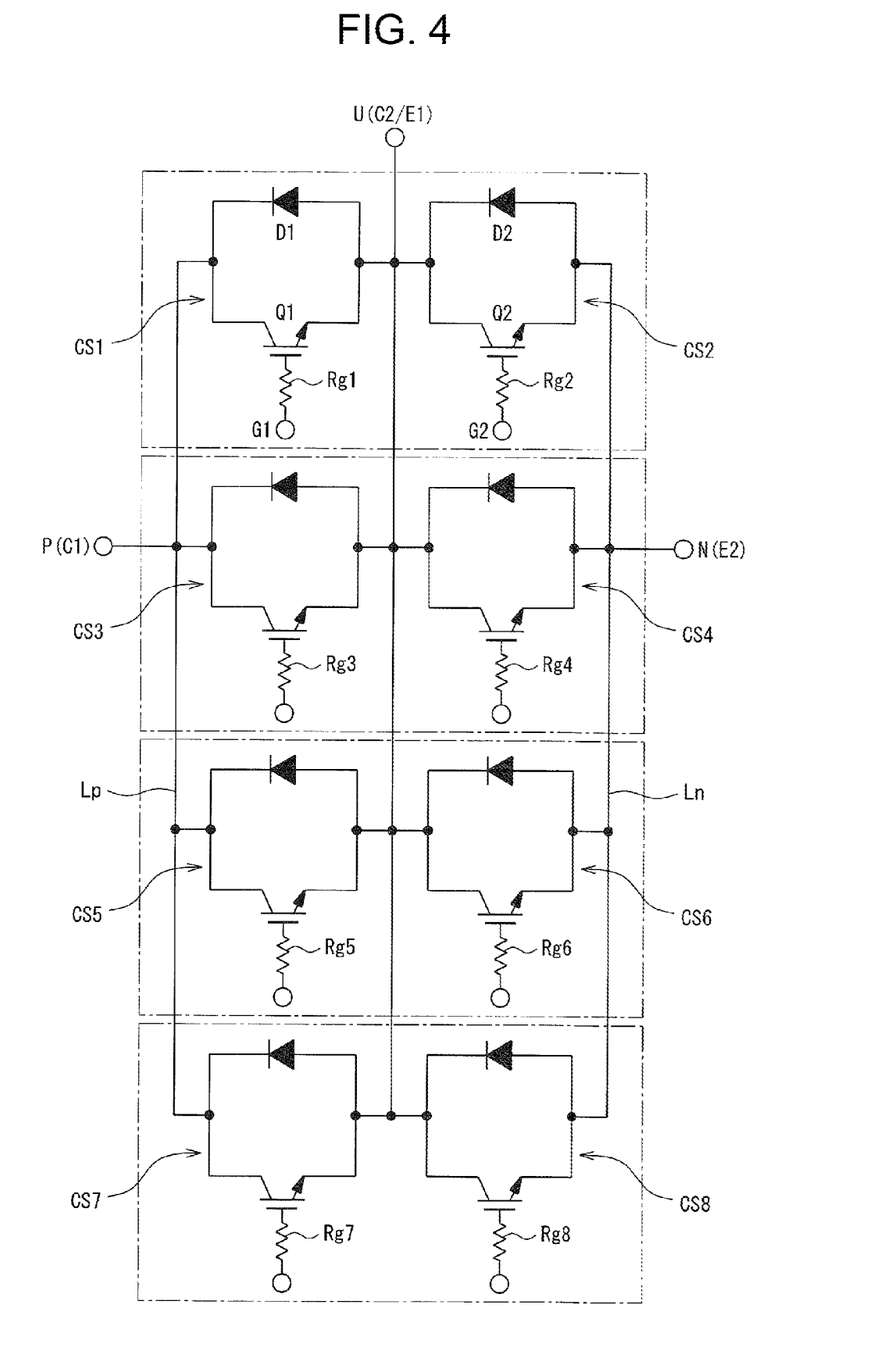
FIG. 4 is a circuit diagram showing an equivalent circuit of a power semiconductor module.

An equivalent circuit of the power semiconductor modules 3A and 3B is configured as shown in FIG. 4. That is, a half-bridge circuit having upper and lower arms connected in series is configured of the semiconductor circuits CS1 and CS2. That is, the upper arm is configured of an insulated gate bipolar transistor Q1 configuring the semiconductor chip 5A of the semiconductor circuit CS1 and a free wheeling diode D1 configuring the semiconductor chip 5B connected in anti-parallel to the insulated gate bipolar transistor Q1. Also, the lower arm is configured of an insulated gate bipolar transistor Q2 configuring the semiconductor chip 5A of the semiconductor circuit CS2 and a free wheeling diode D2 configuring the semiconductor chip 5B connected in anti-parallel to the insulated gate bipolar transistor Q2. In the same way, upper and lower arms are formed of each of the semiconductor circuits CS3 and CS4, CS5 and CS6, and CS7 and CS8, connected in series.

Further, each upper and lower arm is connected in parallel to a positive electrode side power supply line Lp and a negative electrode side power supply line Ln, thereby configuring a one-phase portion of an inverter configuring a power conversion device.

Next, a description will be given of an operation of the first embodiment.

Figure 5A:
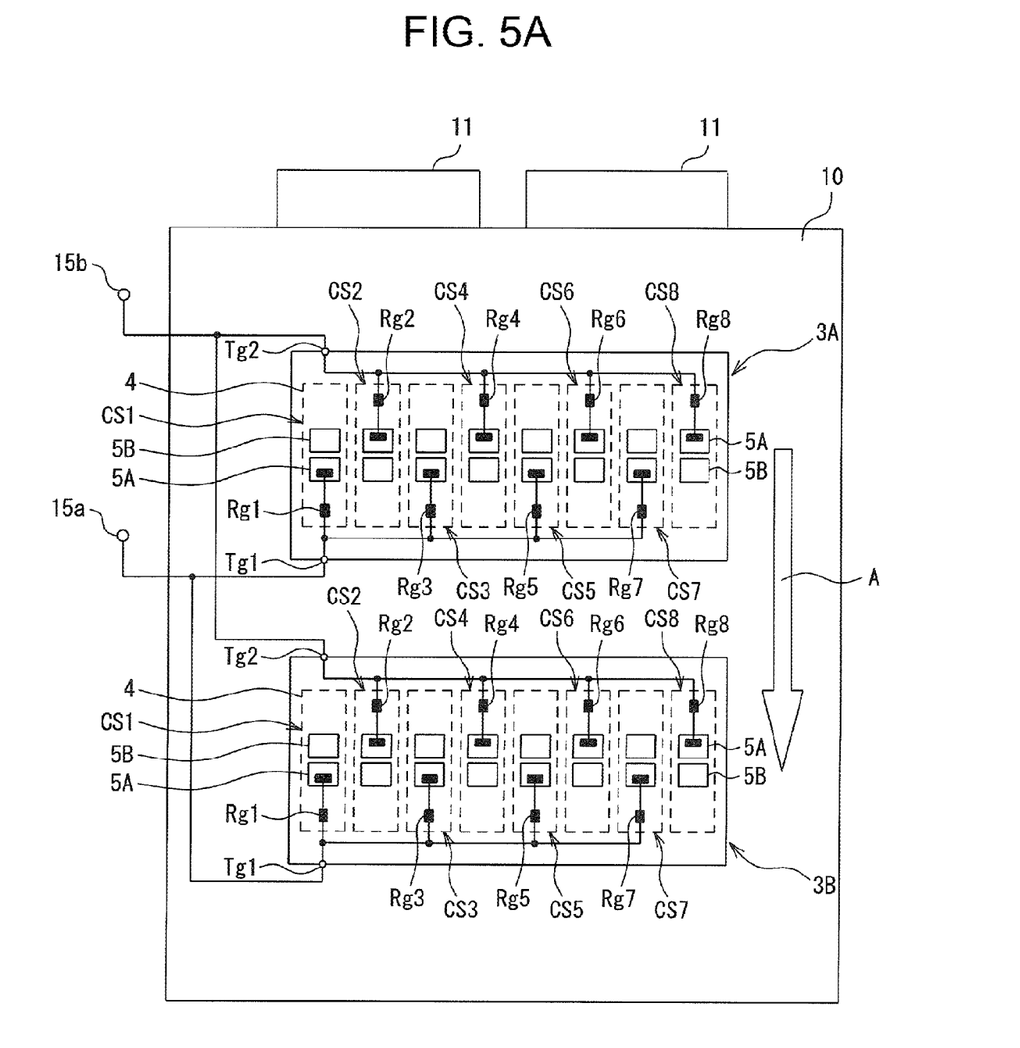
FIGS. 5A and 5B are a schematic configuration diagram showing, respectively, a circuit configuration of a semiconductor device from which a temperature detecting resistor is omitted and a corresponding characteristic diagram showing temperature distribution.

Firstly, a description will be given of a case wherein the signals input into the gate signal input units 15a and 15b are supplied directly to the gate signal input terminals Tg1 and Tg2 of each power semiconductor module 3A and 3B, omitting the disposition of the temperature detecting resistors Rt1 and Rt2 in each power semiconductor module 3A and 3B, as shown in FIG. 5A.

In the configuration of FIG. 5A, the cooling effect of the cooling air supplied from the cooling fans 11 is such that the cooling effect in the upstream side power semiconductor module 3A is high, while the cooling effect in the downstream side power semiconductor module 3B is low. Because of this, the temperature of the downstream side end portion of the upstream side power semiconductor module 3A is a comparatively low temperature, as shown by a black star in FIG. 5B, while the temperature of the downstream side end portion of the downstream side power semiconductor module 3B is a comparatively high temperature, as shown by the other black star in FIG. 5B. Consequently, a temperature difference $\Delta T1$ between the downstream side end portions, which are identical regions, of the upstream side power semiconductor module 3A and downstream side power semiconductor module 3B is a comparatively large temperature difference (for example, 5 to 10° C.)

Figure 5B:
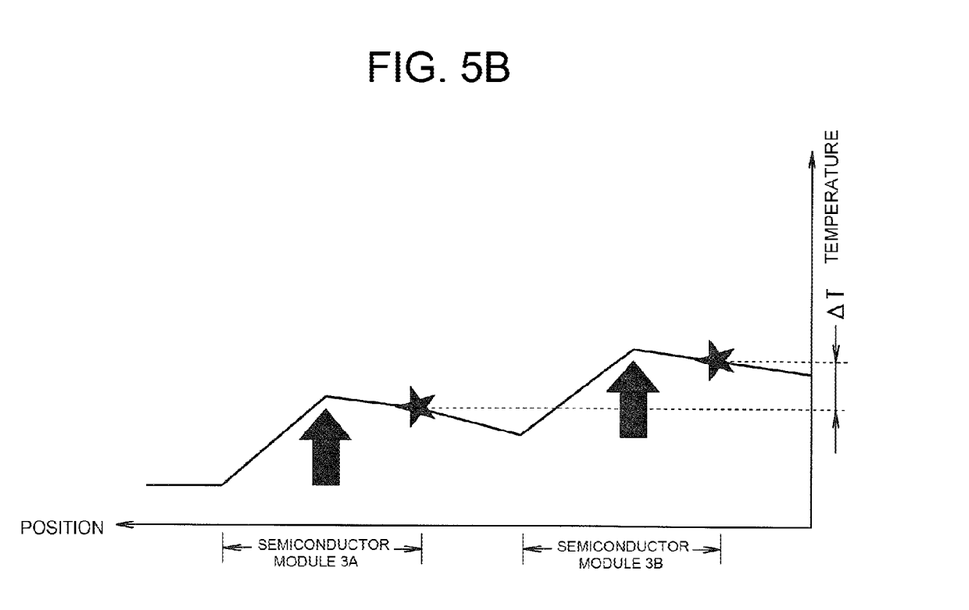

Because of this, the gate voltage applied to the gate terminals of the semiconductor chips 5A of the two power semiconductor modules 3A and 3B is such that, despite there being leeway in the upstream side power semiconductor module 3A when the temperature increases, it is necessary to set the allowable current based on the downstream side power semiconductor module 3B so that the exothermic temperature does not become excessive.

In response to this, according to the first embodiment, the temperature detecting resistors Rt1 and Rt2 are disposed in, for example, the semiconductor circuits CS4 and CS5 in the central portion in the longitudinal direction of each of the power semiconductor modules 3A and 3B.

Further, the gate signals Sg1 and Sgt supplied to the gate signal input units 15a and 15b are supplied via the temperature detecting resistors Rt1 and Rt2 disposed on the semiconductor circuits CS4 and CS5 in the central portion of the downstream side power semiconductor module 3B to the gate signal input terminals Tg1 and Tg2 of the upstream side power semiconductor module 3A.

Meanwhile, the gate signals Sg1 and Sgt supplied to the gate signal input units 15a and 15b are supplied via the temperature detecting resistors Rt1 and Rt2 disposed on the semiconductor circuits CS4 and CS5 in the central portion of the upstream side power semiconductor module 3A to the gate signal input terminals Tg1 and Tg2 of the downstream side power semiconductor module 3B.

As the cooling effect of the cooling air in the temperature detecting resistors Rt1 and Rt2 of the upstream side power semiconductor module 3A at this time is high, the resistance value is low, as seen from the temperature-resistance characteristics of FIG. 3, and conversely, as the cooling effect of the cooling air in the temperature detecting resistors Rt1 and Rt2 of the downstream side power semiconductor module 3B is low, the resistance value is high, as seen from the temperature-resistance characteristics of FIG. 3.

Because of this, as the gate resistance of the insulated gate bipolar transistors configuring the semiconductor chips 5A of the odd-numbered semiconductor circuits CS1, CS3, CS5, and CS7 of the semiconductor circuits CS1 to CS8 of the upstream side power semiconductor module 3A is such that the high value of the temperature detecting resistor Rt1 of the downstream side power semiconductor module 3B is added to the values of the gate resistors Rg1, Rg3, Rg5, and Rg7, the combined gate resistance is high. In the same way, as the gate resistance of the insulated gate bipolar transistors configuring the semiconductor chips 5A of the even-numbered semiconductor circuits CS2, CS4, CS6, and CS8 of the upstream side power semiconductor module 3A is such that the high value of the temperature detecting resistor Rt2 of the downstream side power semiconductor module 3B is added to the values of the gate resistors Rg2, Rg4, Rg6, and Rg8, the combined gate resistance is high.

Also, as the gate resistance of the insulated gate bipolar transistors configuring the semiconductor chips 5A of the odd-numbered semiconductor circuits CS1, CS3, CS5, and CS7 of the semiconductor circuits CS1 to CS8 of the downstream side power semiconductor module 3B is such that the low resistance value of the temperature detecting resistor Rt1 of the upstream side power semiconductor module 3A is added to the values of the gate resistors Rg1, Rg3, Rg5, and Rg7, the combined gate resistance is low. In the same way, as the gate resistance of the insulated gate bipolar transistors configuring the semiconductor chips 5A of the even-numbered semiconductor circuits CS2, CS4, CS6, and CS8 of the downstream side power semiconductor module 3B is such that the low value of the temperature detecting resistor Rt2 of the upstream side power semiconductor module 3A is added to the values of the gate resistors Rg2, Rg4, Rg6, and Rg8, the combined gate resistance is low.

Figure 6:
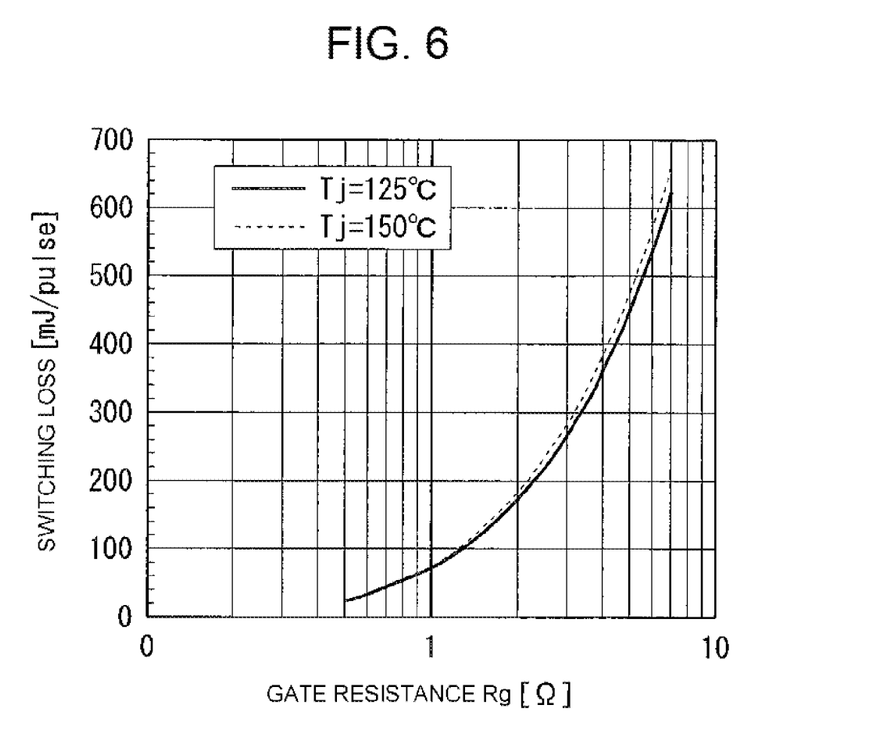

Further, a characteristic diagram representing the relationship between gate resistance and switching loss in the half-bridge circuit wherein the upper arm and lower arm are connected in series has a characteristic that the switching loss increases as the value of a gate resistance Rg increases, as shown in FIG. 6. Herein, FIG. 6 is an example of the characteristics of a large capacity IGBT.

Because of this, the gate resistance value of the insulated gate bipolar transistors configuring the semiconductor chips 5A of the semiconductor circuits CS1 to CS8 of the upstream side power semiconductor module 3A is a high combined gate resistance value wherein the high resistance values of the temperature detecting resistors Rt1 and Rt2 of the downstream side power semiconductor module 3B are added. Because of this, the switching loss of the semiconductor chips 5A of the semiconductor circuits CS1 to CS8 of the upstream side power semiconductor module 3A increases, and the amount of heat generated is increased.

Conversely, as the gate resistance of the insulated gate bipolar transistors configuring the semiconductor chips 5A of the semiconductor circuits CS1 to CS8 of the downstream side power semiconductor module 3B is a low value, the switching loss is reduced, and the amount of heat generated is suppressed.

As a result of this, the temperature difference ΔT between the average temperature of the upstream side power semiconductor module 3A and the average temperature of the downstream side power semiconductor module 3B decreases sufficiently in comparison with that in FIG. 5B, as shown in FIG. 2B.

Because of this, it is possible to increase the freedom of design in terms of the layout according to the attained temperatures of the semiconductor modules 3A and 3B and the design of the cooling fins.

Also, as previously described, it is possible, by causing the resistance values of the gate resistors Rg1 to Rg8 of the semiconductor circuits CS1 to CS8 of the power semiconductor modules 3A and 3B to differ in accordance with the longitudinal direction temperature distribution of the semiconductor modules, to average the longitudinal direction temperature distribution.

In the first embodiment, a description has been given of a case in which there are two semiconductor modules. However, the invention also includes cases in which there are three or more semiconductor modules. The thinking is also the same in cases in which there are three or more semiconductor modules.

Figure 7:
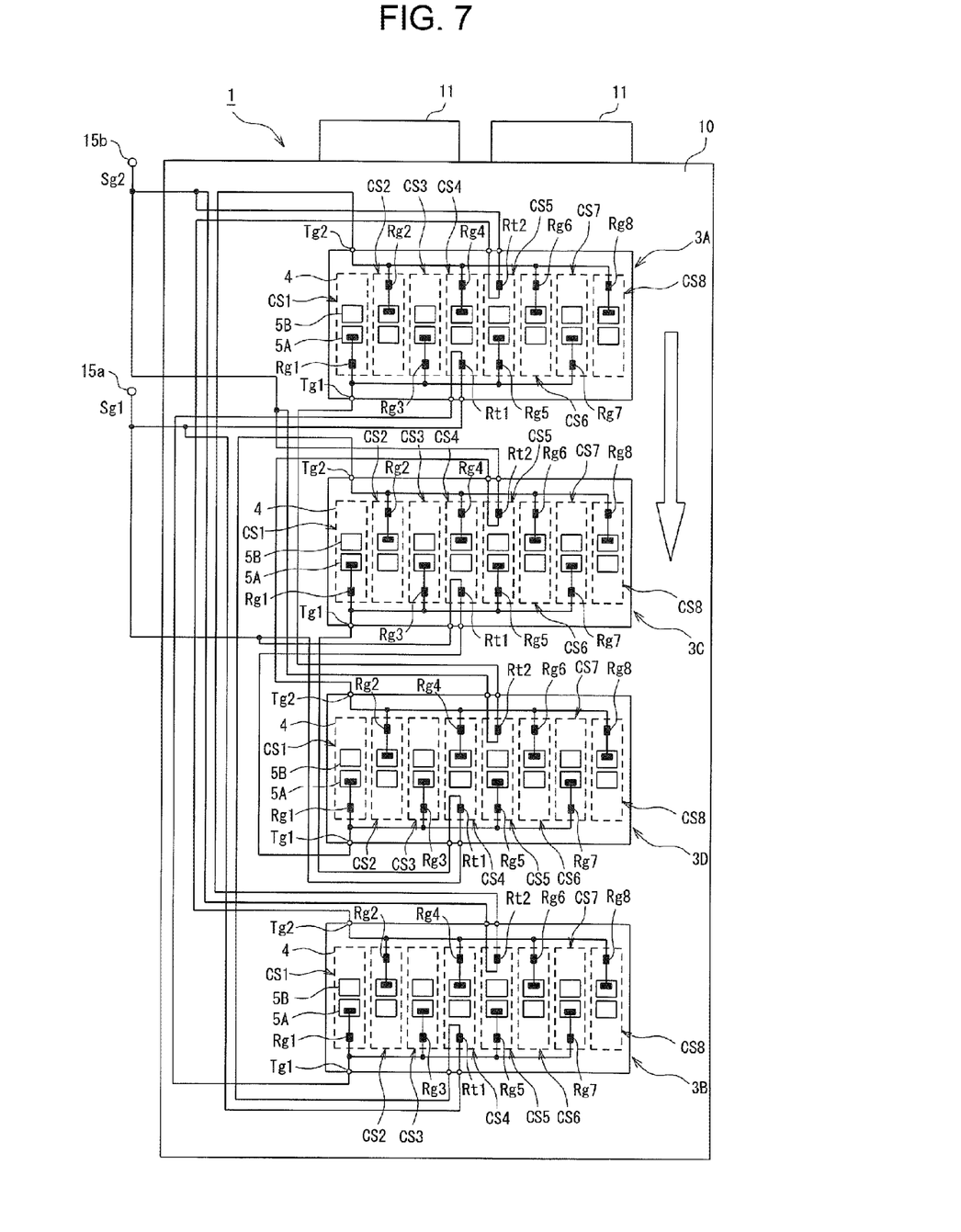
FIG. 7 is a schematic configuration diagram showing an example of a modification of the first embodiment.

That is, when there are four semiconductor modules, the configuration is such that semiconductor modules 3C and 3D having the same configuration are disposed between the semiconductor modules 3A and 3B of the first embodiment, as shown in FIG. 7, and gate signals individually passing through the temperature detecting resistors Rt1 and Rt2 installed in the semiconductor module 3B on the most downstream side of the refrigerant flow are input into the gate signal input terminals Tg1 and Tg2 of the semiconductor module 3A on the most upstream side of the refrigerant flow. Gate signals individually passing through the temperature detecting resistors Rt1 and Rt2 installed in the semiconductor module 3A on the most upstream side of the refrigerant flow are input into the gate signal input terminals Tg1 and Tg2 of the semiconductor module 3B on the most downstream side of the refrigerant flow. The semiconductor module 3C next on the upstream side after the semiconductor module 3A on the most upstream side of the refrigerant flow, and the semiconductor module 3D next on the downstream side after the semiconductor module 3B on the most downstream side of the refrigerant flow, are also configured in the same way. Further, when the number of semiconductor modules exceeds four, it is sufficient that a semiconductor module on the upstream side of the refrigerant flow and a semiconductor module corresponding thereto on the downstream side are configured as described above.

In particular, a description will be given of a case in which n semiconductor modules are disposed, wherein n is an odd number. In this case, the downstream side semiconductor module corresponding to the $(n+1)/2^{th}$ semiconductor module from the top of the refrigerant flow (the semiconductor module in a central portion along the refrigerant flow) is the semiconductor module itself, in which case the gate signals are input via the temperature detecting resistors installed in that semiconductor module to the gate resistors connected to that semiconductor chip.

In this way, it being possible to average the longitudinal direction temperature distribution by causing the resistance values of the gate resistors of the semiconductor circuits of each power semiconductor module to differ in accordance with the longitudinal direction temperature distribution of the semiconductor modules also holds true when there are three or more semiconductor modules.

Next, a description will be given, based on FIGS. 8A and 8B, of a second embodiment of the invention.

In the second embodiment, when the semiconductor circuits CS1 to CS8 are disposed in a direction intersecting with a refrigerant flow direction A, the temperature distribution is averaged by changing the connections of the gate resistors among the semiconductor circuits CS1 to CS8 inside each power semiconductor module 3A and 3B.

Figure 8A:
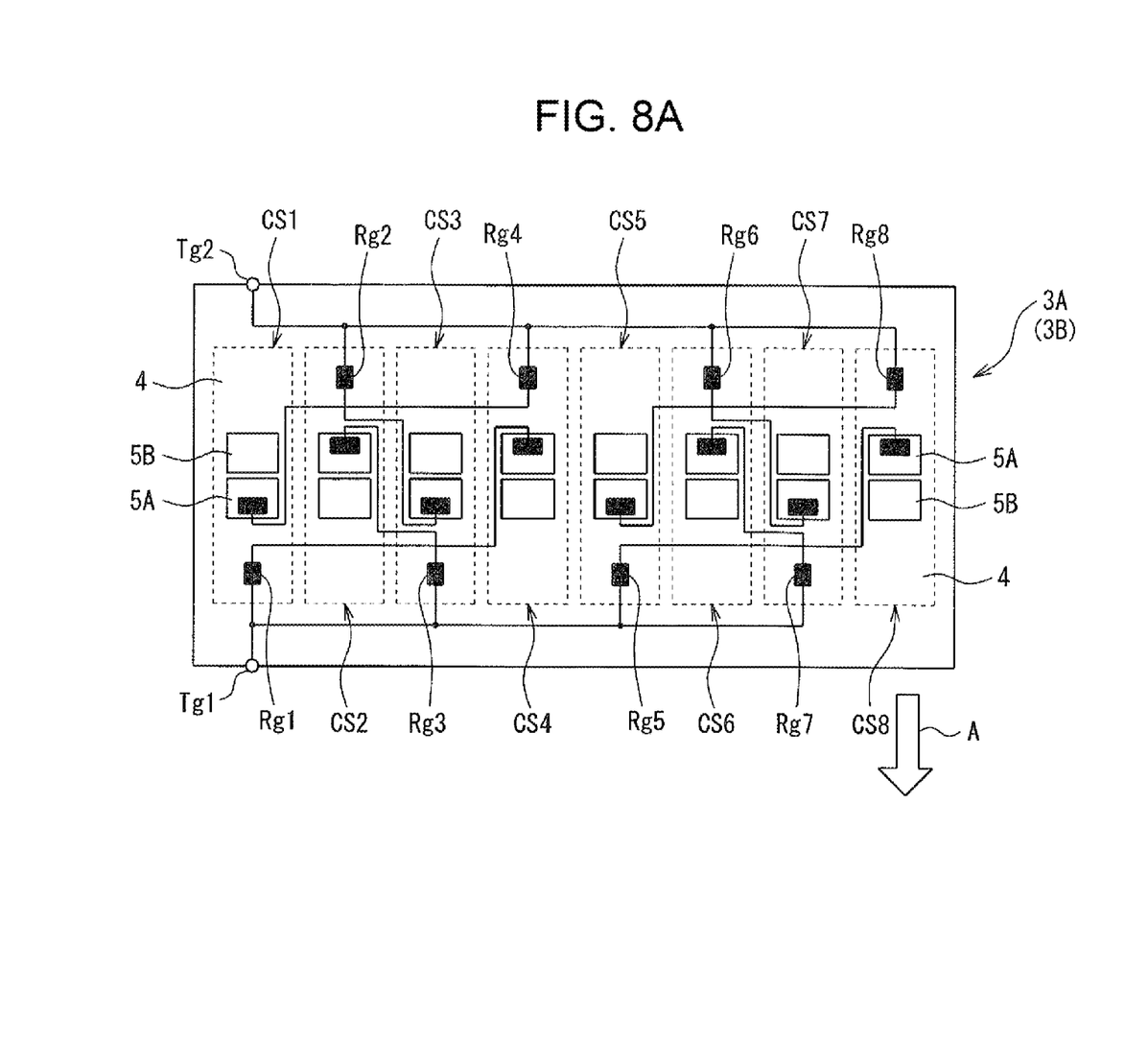
FIGS. 8A and 8B are a schematic configuration diagram showing, respectively, a circuit configuration of a semiconductor device according to a second embodiment of the invention and a corresponding characteristic diagram showing temperature distribution.

That is, in the second embodiment, the gate terminals of the insulated gate bipolar transistors configuring the semiconductor chips 5A of the semiconductor circuits CS4 and CS5 in the central portion are connected to the gate signal input terminals Tg1 and Tg2 via the gate resistors Rg1 and Rg8 formed in the semiconductor circuits CS1 and CS8 at either end side, as shown in FIG. 8A.

Also, the gate terminals of the insulated gate bipolar transistors configuring the semiconductor chips 5A of the semiconductor circuits CS3 and CS6 are connected to the gate signal input terminals Tg1 and Tg2 via the gate resistors Rg2 and Rg7 formed in the semiconductor circuits CS2 and CS7 inward from either end.

Furthermore, the gate terminals of the insulated gate bipolar transistors configuring the semiconductor chips 5A of the semiconductor circuits CS2 and CS7 are connected to the gate signal input terminals Tg1 and Tg2 via the gate resistors Rg3 and Rg6 formed in the semiconductor circuits CS3 and CS6 inward from either end.

Further still, the gate terminals of the insulated gate bipolar transistors configuring the semiconductor chips 5A of the semiconductor circuits CS1 and CS8 at either end side are connected to the gate signal input terminals Tg1 and Tg2 via the gate resistors Rg4 and Rg5 formed in the semiconductor circuits CS4 and CS5 in the central portion.

According to the second embodiment, the semiconductor circuits CS4 and CS5 in the central portion, wherein cooling performance is low and the temperature is high, are connected to the gate signal input terminals Tg1 and Tg2 via the gate resistors Rg1 and Rg8, which act as the gate resistors of the semiconductor circuits CS4 and CS5, formed in the semiconductor circuits CS1 and CS8 in either side portion, wherein cooling capacity is high and the temperature is low. Because of this, it is possible for the gate resistance value of the insulated gate bipolar transistors configuring the semiconductor chips 5A of the central portion semiconductor circuits CS4 and CS5 to be set low, and thus possible to further reduce switching loss, and sufficiently suppress the exothermic temperature.

Moreover, as the gate resistance value increases further with respect to the central portion gate resistance value going from the central portion to either end side, it is possible to set the gate resistance value progressively higher going toward either end side, and thus possible to further increase switching loss, and increase the exothermic temperature.

Figure 8B:
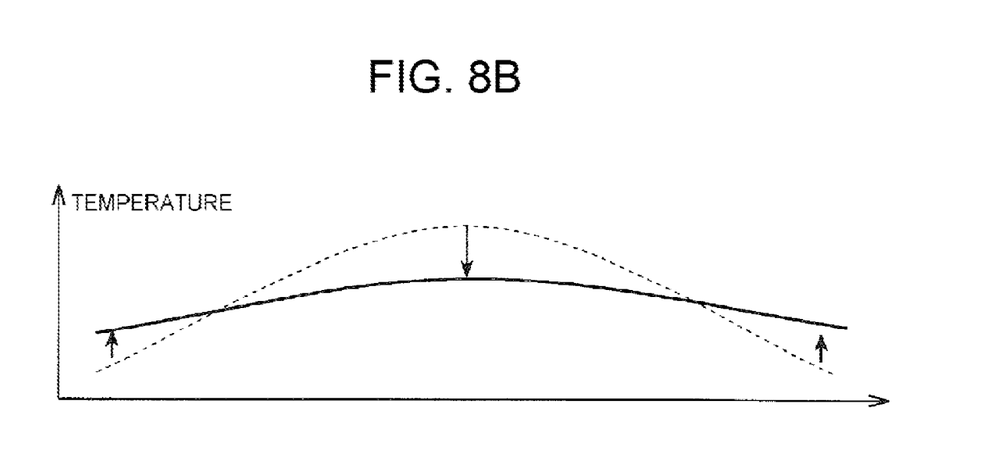

As a result of this, it is possible to further average the longitudinal direction temperature distribution of the power semiconductor modules 3, as shown in FIG. 8B, possible to further reduce the maximum temperature, and thus possible to further increase the allowable current amount of the semiconductor chip 5A of each semiconductor circuit CS1 to CS8.

In the first and second embodiments, a description has been given of a case wherein the gate resistors Rg1 to Rg8 are vertical diffusers but, the invention not being limited to this, discrete resistors may also be used.

Also, in the first and second embodiments, a description has been given of a case wherein the semiconductor chip 5A is configured of an insulated gate bipolar transistor but, the invention not being limited to this, it is possible to apply another voltage controlling semiconductor element having the gate terminal of a power field-effect transistor, or the like.

Furthermore, in the first and second embodiments, a description has been given of a case wherein one set of the semiconductor chips 5A and 5B is mounted on the semiconductor circuits CS1 to CS8 but, the invention not being limited to this, two or more sets of the semiconductor chips 5A and 5B may be mounted.

Also, in the first and second embodiments, a description has been given of a case wherein the eight semiconductor circuits CS1 to CS8 are disposed in parallel in the power semiconductor modules 3 but, the invention not being limited to this, it is possible to dispose an arbitrary number of semiconductor circuits in parallel. In the same way, it is also possible to set the number of power semiconductor modules mounted above the cooling fins 10 to an arbitrary number, and it is also possible to select an optimal gate resistance in accordance with the temperature of each power semiconductor module as the gate resistance set in the power semiconductor modules.

Also, in the first and second embodiments, a description has been given of a case wherein cooling air is applied as a cooling medium but, the invention not being limited to this, it is possible to apply another cooling medium, such as cooling water.

Also, the invention not being limited to the heretofore described power converting inverter device, the invention can be applied to another semiconductor device, such as another power conversion device or a high frequency application switching IC, using a power semiconductor module.

What is claimed is:

1. A semiconductor device, comprising
a semiconductor module wherein a plurality of semiconductor circuits on which are mounted one or more semiconductor chips, each having a gate terminal and a gate resistor connected to the gate terminal, are disposed in parallel, wherein
a plurality of the semiconductor modules are disposed above a cooling body so that an array direction of the semiconductor modules is a direction following a refrigerant flow,
at least one temperature detecting resistor is disposed in each semiconductor module, and
a semiconductor module positioned on an upstream side of the refrigerant flow and a semiconductor module positioned on a downstream side of the refrigerant flow are such that a gate signal is supplied via a temperature detecting resistor of the semiconductor module positioned on the downstream side of the refrigerant flow to a gate signal input terminal of the semiconductor module positioned on the upstream side of the refrigerant flow, while a gate signal is supplied via a temperature detecting resistor of the semiconductor module positioned on the upstream side of the refrigerant flow to a gate signal input terminal of the semiconductor module positioned on the downstream side of the refrigerant flow.

2. A semiconductor device, comprising
a semiconductor module wherein a plurality of semiconductor circuits on which are mounted one or more semiconductor chips, each having a gate terminal and a gate resistor connected to the gate terminal, are disposed in parallel, wherein
four or more of the semiconductor modules are disposed above a cooling body so that an array direction of the semiconductor modules is a direction following a refrigerant flow,
at least one temperature detecting resistor is disposed in each semiconductor module,
a semiconductor module positioned on a most upstream side of the refrigerant flow and a semiconductor module positioned on a most downstream side of the refrigerant flow are such that a gate signal is supplied via a temperature detecting resistor of the semiconductor module positioned on the most downstream side of the refrigerant flow to a gate signal input terminal of the semiconductor module positioned on the most upstream side of the refrigerant flow, a gate signal is supplied via a temperature detecting resistor of the semiconductor module positioned on the most upstream side of the refrigerant flow to a gate signal input terminal of the semiconductor module positioned on the most downstream side of the refrigerant flow, and for each of others of the four or more of the semiconductor modules, a next-most-upstream semiconductor module positioned next-most-upstream on the upstream side of the refrigerant flow and a next-most-downside semiconductor module positioned next-most-downside on the downstream side of the refrigerant flow are such that a gate signal is supplied via a temperature detecting resistor of the next-most-downstream semiconductor module to a gate signal input terminal of the next-most-upstream semiconductor module, and a gate signal is supplied via a temperature detecting resistor of the next-most-upstream semiconductor module to a gate signal input terminal of the next-most-downstream semiconductor module.

3. The semiconductor device according to claim 1, wherein each semiconductor module is such that gate resistors of semiconductor circuits on respective end sides of a semiconductor module are connected to gate terminals of semiconductor chips of semiconductor circuits in at least central portions of the semiconductor module, and gate resistors of the semiconductor circuits in the at least central portions of the semiconductor module are connected to gate terminals of semiconductor chips of the semiconductor circuits on the respective end sides.

4. The semiconductor device according to claim 1, wherein the at least one temperature detecting resistor is configured of a vertical diffusion structure forming a vertical direction current path or a discrete resistor, and has positive temperature-resistance characteristics.

5. The semiconductor device according to claim 1, wherein the semiconductor chip is a voltage controlling semiconductor element.

6. The semiconductor device according to claim 2, wherein each semiconductor module is such that gate resistors of semiconductor circuits on respective end sides of a semiconductor module are connected to gate terminals of semiconductor chips of semiconductor circuits in at least central portions of the semiconductor module, and gate resistors of the semiconductor circuits in the at least central portions of the semiconductor module are connected to gate terminals of semiconductor chips of the semiconductor circuits on the respective end sides.

7. An apparatus, comprising:

a plurality of semiconductor modules; and a cooling device configured to distribute a coolant in a flow direction;

wherein the plurality of semiconductor modules are arrayed transversely to the flow direction, and include at least an upstream module and a downstream module, the downstream module being located downstream of the upstream module with respect to the flow direction, the upstream module includes an upstream resistor and an upstream gate input terminal, the downstream module includes a downstream resistor and a downstream gate input terminal, and a gate signal is coupled via the downstream resistor to the upstream gate signal input terminal, and is coupled via the upstream resistor to the downstream gate signal input terminal.

8. The apparatus of claim 7, wherein:

intervening modules are located between the upstream module and the downstream module;

an upstream intervening module of the intervening modules is closer to the upstream module than is a downstream intervening module of the intervening modules;

the upstream intervening module includes an upstream intervening resistor and an upstream intervening gate input terminal, and the downstream intervening module includes a downstream intervening resistor and a downstream intervening gate input terminal, and the gate signal is coupled via the downstream intervening resistor to the upstream intervening gate signal input terminal, and is coupled via the upstream intervening resistor to the downstream intervening gate signal input terminal.

* * * * *